(12) United States Patent
Park et al.

(10) Patent No.: US 7,056,776 B2
(45) Date of Patent: Jun. 6, 2006

(54) SEMICONDUCTOR DEVICES HAVING METAL CONTAINING N-TYPE AND P-TYPE GATE ELECTRODES AND METHODS OF FORMING THE SAME

(75) Inventors: Seong-Geon Park, Gyeonggi-do (KR); Gil-Heyun Choi, Gyeonggi-do (KR); Sang-Bom Kang, Seoul (KR); You-Kyoung Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/940,159

(22) Filed: Sep. 14, 2004

(65) Prior Publication Data

US 2005/0064653 A1 Mar. 24, 2005

(30) Foreign Application Priority Data

Sep. 18, 2003 (KR) .................... 10-2003-0064790

(51) Int. Cl.
*H01L 21/00* (2006.01)
*H01L 21/84* (2006.01)

(52) U.S. Cl. .................. 438/157; 438/197; 438/283

(58) Field of Classification Search ................ 438/157, 438/197, 199, 283, 559; 257/275, 365, 368, 257/412

See application file for complete search history.

(56) References Cited

U.S. PATENT DOCUMENTS

| | | | |
|---|---|---|---|
| 6,743,704 B1 * | 6/2004 | Takahashi | 438/559 |
| 6,894,353 B1 * | 5/2005 | Samavedam et al. | 257/365 |
| 2002/0151125 A1 | 10/2002 | Kim et al. | 438/199 |
| 2004/0180487 A1 * | 9/2004 | Eppich et al. | 438/199 |

FOREIGN PATENT DOCUMENTS

| | | |
|---|---|---|
| KR | 10-0258881 | 6/2000 |
| KR | 2000-0044674 | 7/2000 |
| KR | 10-0399356 | 9/2003 |

OTHER PUBLICATIONS

Wolf "PMOS Devices with *p+*-Polysilicon Gates" *Silicon Processing For The VLSI Era*—vol. III chapter 5.8.4 pp. 311-313 Lattice Press (1994).

* cited by examiner

*Primary Examiner*—Phuc T. Dang
(74) *Attorney, Agent, or Firm*—Myers Bigel Sibley & Sajovec

(57) ABSTRACT

A semiconductor device has at least two different gate electrodes. The two different gate electrodes include a first gate electrode on a first gate insulation layer. The first gate electrode includes a first metal-containing conductive pattern on the first gate insulation layer and a second metal-containing conductive pattern. A second gate electrode is provided on a second gate insulation layer and includes a third metal-containing conductive material on the second gate insulation layer. The first metal-containing conductive pattern and the third metal-containing conductive pattern have different work functions from each other. A surface of the second metal-containing conductive pattern and a surface of the third metal-containing conductive pattern are substantially planar. Methods of fabrication such semiconductor devices are also provided.

40 Claims, 4 Drawing Sheets

SEMICONDUCTOR DEVICES HAVING METAL CONTAINING N-TYPE AND P-TYPE GATE ELECTRODES AND METHODS OF FORMING THE SAME

CLAIM OF PRIORITY

This application claims priority under 35 U.S.C. § 119 from Korean Patent Application No. 2003-64790, filed Sep. 18, 2003, the disclosure of which is hereby incorporated herein by reference in its entirety.

1. Field of the Invention

The present invention generally relates to semiconductor devices and methods of forming the same. More particularly, the present invention relates to semiconductor devices having different gates and methods of forming the same.

2. Background of the Invention

In semiconductor devices, MOS transistors may, typically, be classified into two groups, NMOS transistors and PMOS transistors. A semiconductor device that includes both NMOS and a PMOS transistors may be called by a CMOS-type semiconductor device.

NMOS transistors typically include N-type source/drain regions that are spaced apart from each other. When the NMOS transistor is turned on, a channel is formed between the N-type source/drain regions with electrons as carriers. PMOS transistors typically include P-type source/drain regions that are spaced apart from each other. When the PMOS transistor is turned on, a channel is formed between the P-type source/drain regions with holes as carriers. The channel of the NMOS transistor is controlled by an NMOS gate electrode disposed thereon. The channel of the PMOS transistor is controlled by a PMOS gate electrode disposed thereon.

Conventionally, all of the NMOS gate electrodes and the PMOS gate electrodes may be formed of polysilicon doped by N-type impurities. Thus, the channel of the NMOS transistor may be a surface channel disposed at a surface of a semiconductor substrate. The channel of the PMOS transistor may be a buried channel spaced from a predetermined depth from a surface of a semiconductor substrate.

Currently, as semiconductor devices become more highly integrated, lower operation voltages may be required. Additionally, faster operation speed may be required in a semiconductor device. A gate oxide layer of the PMOS transistor having the buried channel may have an effective thickness that may increase a threshold voltage of the PMOS transistor. In this case, the operation voltage of the transistor may be increased but the operation speed of the transistor may be decreased. Thus, the low voltage, high speed performance of the CMOS semiconductor device may be degraded. In order to solve this problem, S. Wolf et al. "Silicon Processing For The VLSI ERA, Vol. III," p. 311 describes a method of forming the NMOS gate electrode of polysilicon doped by N-type impurities and the PMOS gate electrode of polysilicon doped by P-type impurities.

In the case where the PMOS gate electrodes are formed of polysilicon doped by P-type impurities, a work function of the PMOS gate electrode can be increased, so that the channel of the PMOS transistor can be formed as a surface channel. That is, the effective thickness of the gate oxide of the PMOS transistor can be reduced to decrease the threshold voltage in the PMOS transistor. Thus, the operation speed of the transistor may be increased but the operation voltage may be decreased.

In the case where the NMOS transistor gate is formed of polysilicon doped by N-type impurities and the PMOS transistor gate is formed of polysilicon doped by P-type impurities, depletion layers can be formed in the NMOS gate electrode and the PMOS gate electrode. That is, in order to turn on the NMOS transistor, a positive voltage (higher than a source voltage) should be applied to the NMOS gate electrode to form a depletion layer in a part of the NMOS gate electrode adjacent to a gate oxide layer. However, in order to turn on the PMOS transistor, a negative voltage (lower than a source voltage) should be applied to the PMOS gate electrode to form a depletion layer in the PMOS gate electrode adjacent to a gate oxide layer. Since the depletion layers in the gate electrodes can be included in the effective thicknesses of the gate oxide layers, absolute values of threshold voltages of the NMOS and PMOS transistors may be increased. Thus, the operation voltage may be increased but the operation speed may be decreased in the transistors.

Furthermore, impurities in the PMOS gate electrode, such as boron (B), can penetrate into the gate oxide layer under the PMOS gate electrode. This may also result in degradation of performance of the PMOS transistor.

SUMMARY OF THE INVENTION

Some embodiments of the present invention provide a semiconductor device and methods of fabrication a semiconductor device having at least two different gate electrodes. The two different gate electrodes include a first gate electrode on a first gate insulation layer. The first gate electrode is provided on a first gate insulation layer. The first gate electrode includes a first metal-containing conductive pattern on the first gate insulation layer and a second metal-containing conductive pattern on the first metal-containing conductive pattern opposite the first gate insulation layer. The second metal-containing conductive pattern has a surface opposite the first gate insulation layer. A second gate electrode is provided on a second gate insulation layer. The second gate electrode includes a third metal-containing conductive pattern on the second gate insulation layer wherein the third metal-containing conductive pattern has a surface opposite the second gate insulation layer that is substantially planar with the surface of the second metal-containing conductive pattern. The first metal-containing conductive pattern and the third metal-containing conductive pattern have different work functions from each other.

In certain embodiments of the present invention, the first gate insulation layer and the second gate insulation layer are a same insulation material. In other embodiments of the present invention, the first gate insulation layer and the second gate insulation layer are different insulation materials. The first gate insulation layer and the second gate insulation layer may be the same or different thicknesses.

In further embodiments of the present invention, one of the first metal-containing conductive pattern and the third metal-containing conductive pattern includes a material having a work function ranging from about 4.0 eV to about 4.4 eV and the other of the first metal-containing conductive pattern and the third metal-containing conductive pattern includes a material having a work function ranging from about 4.8 eV to about 5.2 eV. Furthermore, one of the first metal-containing conductive pattern and the third metal-containing conductive pattern may include a hafnium layer, an aluminum layer, a titanium layer, a niobium layer, a tantalum layer, a molybdenum layer and/or a tantalum nitride layer, and the other of the first metal-containing conductive pattern and the third metal-containing conductive pattern may include an iridium layer, a platinum layer, a ruthenium dioxide layer, a molybdenum nitride ($Mo_2N$)

layer, a tungsten nitride layer and/or a tantalum nitride layer. In particular embodiments of the present invention, one of the first metal-containing conductive pattern and the third metal-containing conductive pattern includes a first tantalum nitride layer and the other of the first metal-containing conductive pattern and the third metal-containing conductive pattern includes a second tantalum nitride layer having a different nitrogen concentration from the first tantalum nitride.

In yet other embodiments of the present invention, a semiconductor device having at least two different gates includes a first gate insulation layer on a first active region of a semiconductor substrate and a second gate insulation layer on a second active region of the semiconductor substrate. A first gate electrode includes a double-layered structure on the first gate insulation layer. The double layered structure includes a first metallic conductive pattern and a second metallic conductive pattern and has a first surface adjacent the first gate insulation layer and a second surface opposite the first surface. A second gate electrode of a single-layered structure is provided on the second gate insulation layer. The single layered structure includes a metal-containing conductive material and has a first surface adjacent the second gate insulation layer and a second surface opposite the first surface. The first metallic conductive pattern and the metal-containing conductive material have different work functions from each other, and the second surface of the double-layered structure and the second surface of the single layered structure are disposed at substantially a same distance from the semiconductor substrate.

In additional embodiments of the present invention, field oxide layers are provided at the semiconductor substrate to define the first active region and the second active region. The second metallic conductive pattern may include the metal-containing conductive material. Furthermore, one of the first metallic conductive pattern and the metal-containing conductive material may have a work function ranging from about 4.0 eV to about 4.4 eV and the other of the first metallic conductive pattern and the metal-containing conductive material may have a work function ranging from about 4.8 eV to about 5.2 eV. Additionally, one of the first metallic conductive pattern and the metal-containing conductive material may be provided by a hafnium layer, an aluminum layer, a titanium layer, a niobium layer, a tantalum layer, a molybdenum layer and/or a tantalum nitride layer, and the other of the first metallic conductive pattern and the metal-containing conductive material may be provided by an iridium layer, a platinum layer, a ruthenium dioxide layer, a molybdenum nitride ($Mo_2N$) layer, a tungsten nitride layer and/or a tantalum nitride layer. One of the first metallic conductive pattern and the metal-containing conductive material could also be provided by a first tantalum nitride layer and the other of the first metallic conductive pattern and the metal-containing conductive material could be provided by a second tantalum nitride layer. The first tantalum nitride layer has a different nitrogen concentration from the second tantalum nitride.

The first and second gate insulation layers may be a same or different insulation material.

In still further embodiments of the present invention, the semiconductor device further includes a first low-resistance conductive pattern stacked on the first gate electrode and a second low-resistance conductive pattern stacked on the second gate electrode. The first low-resistance conductive pattern and the second low-resistance conductive pattern are of conductive materials having lower resistances than the first gate electrode and the second gate electrode. Additionally, first impurity-doped regions doped by impurities of a first conductive type in the first active region may be provided at both sides of the first gate electrode and second impurity-doped regions doped by impurities of a second conductive type in the second active region may be provided at both sides of the second gate electrode.

Further embodiments of the present invention provide methods forming a semiconductor device having two different gates by sequentially forming a first insulation layer and a first metallic conductive layer on a surface of the semiconductor substrate having a first active region and a second active region, patterning the first metallic conductive layer to form an opening exposing a first insulation layer on a predetermined region of the second active region, forming a second metallic conductive layer on a surface of the semiconductor substrate to fill the opening and successively patterning the second metallic conductive layer, the first metallic conductive layer and the first insulation layer to form a first gate insulation layer and a first gate electrode of a double-layered structure at the first active region and to form a second gate insulation layer and a second gate electrode of a single-layered structure at the second active region. The first metallic conductive layer and the second metallic conductive layer have a different work function from each other, and the first gate electrode includes a first metallic conductive pattern and a second metallic conductive pattern that are sequentially stacked.

Further embodiments of the present invention include forming field oxide layers at a semiconductor substrate having a first region and a second region to define the first active region and the second active region at the first region and the second region, respectively.

In additional embodiments of the present invention, one of the first metallic conductive layer and the second metallic conductive layer includes a metal-containing conductive material having a work function ranging from about 4.0 eV to about 4.4 eV and the other of the first metallic conductive layer and the second metallic conductive layer includes a metal-containing conductive material having a work function ranging from about 4.8 eV to about 5.2 eV. One of the first metallic conductive layer and the second metallic conductive layer may include a hafnium layer, an aluminum layer, a titanium layer, a niobium layer, a tantalum layer, a molybdenum layer and/or a tantalum nitride layer, and the other of the first metallic conductive layer and the second metallic conductive layer may include an iridium layer, a platinum layer, a ruthenium dioxide layer, a molybdenum nitride ($Mo_2N$) layer, a tungsten nitride layer and/or a tantalum nitride layer. One of the first metallic conductive layer and the second metallic conductive layer may include a first tantalum nitride layer and the other of the first metallic conductive layer and the second metallic conductive layer may include a second tantalum nitride layer. The first tantalum nitride layer may have a different nitrogen concentration from the second tantalum nitride.

Further embodiments of the present invention include selectively curing the exposed first insulation layer before forming the second metallic conductive layer.

In additional embodiments of the present invention, forming the second metallic conductive layer is preceded by removing the first insulation layer exposed by the opening to expose a predetermined region of the second active region and selectively forming a second insulation layer at a surface of the exposed second active region. In such embodiments, the second metallic conductive layer is formed on the first metallic conductive layer and the second insulation layer.

In yet other embodiments of the present invention, the second metallic conductive layer is formed to have a planar top surface. The second metallic conductive layer may also be formed with a thickness of at least half a width of the opening. Further embodiments of the present invention include planarizing a top surface of the second metallic conductive layer after forming the second metallic conductive layer.

In still further embodiments of the present invention, forming the second metallic conductive layer is followed by forming a low-resistance conductive layer having a lower resistance than the first metallic conductive layer and the second metallic conductive layer on the second metallic conductive layer. Forming the gate electrodes includes successively patterning the low-resistance conductive layer, the second metallic conductive layer, the first metallic conductive layer and the first insulation layer to form the first gate insulation layer, the first gate electrode and a first low resistance conductive pattern sequentially stacked on the first active region and to form the second gate insulation layer, the second gate electrode and a second low resistance conductive pattern sequentially stacked on the second active region.

In additional embodiments of the present invention, the second gate electrode is formed of a part of the second metallic conductive layer. The second gate electrode may have a narrower width than the width of the opening.

Some embodiments of the present also include forming first impurity-doped regions doped by impurities of a first conductive type at the first active region at both sides of the first gate electrode and forming second impurity-doped regions doped by impurities of a second conductive type at the second active region at both sides of the second gate electrode.

DETAILED DESCRIPTION

Figure 1:
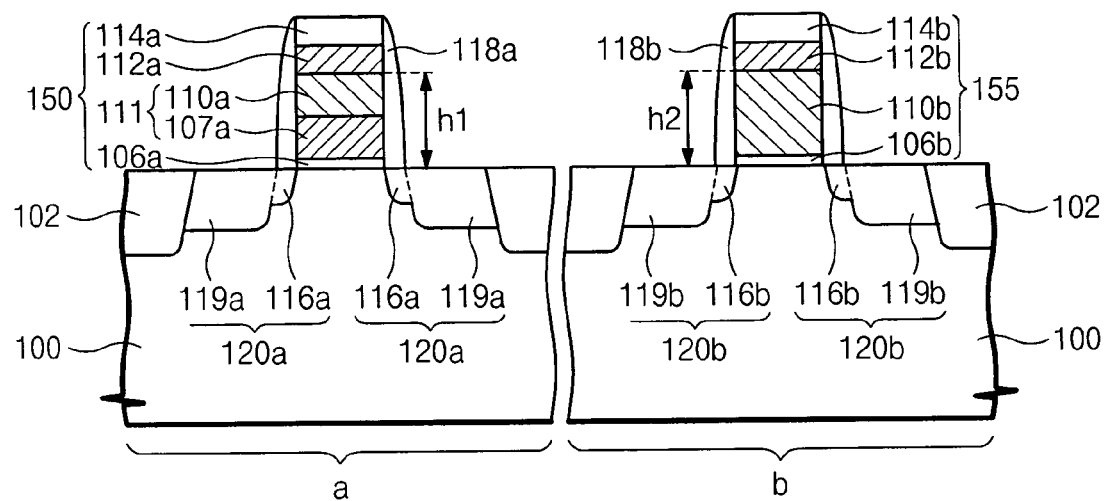
FIG. 1 is a cross-sectional view of a semiconductor device having dual gates according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

In FIGS. 1 through 7, a reference letter "a" indicates a first region, and another reference letter "b" indicates a second region.

FIG. 1 is a cross-sectional view of a semiconductor device having dual gates according to some embodiments of the present invention. Referring to FIG. 1, a semiconductor substrate 100 includes the first region a and the second region b. One of the first region a and the second region b corresponds to a region where an NMOS transistor is formed, i.e., an NMOS region. The other corresponds to a region where a PMOS transistor is formed, i.e., a PMOS region.

Field oxide layers 102 may be provided at predetermined regions of the semiconductor substrate 100, thereby defining a first active region and a second active region at the first region a and the second region b, respectively. The field oxide layers 102 may be trench-type.

A first gate pattern 150 is provided to cross over the first active region, and a second gate pattern 155 is provided to cross over the second active region. The first gate pattern 150 includes a first gate insulation layer 106a, a first gate electrode 111, a first low-resistance conductive pattern 112a and a first hard mask pattern 114a that are sequentially stacked. The second gate pattern 155 includes a second gate insulation layer 106b, a second gate electrode 110b, a second low-resistance conductive pattern 112b and a second hard mask pattern 114b that are sequentially stacked.

The first gate electrode 111 includes a double-layered structure of a lower metallic conductive pattern 107a and an upper metallic conductive pattern 110a that are sequentially stacked. The second gate electrode 110b includes a single-layered structure. The height h1 of the double-layered structure of the first gate electrode 111 may be substantially the same as the height h2 of the single-layered structure of the second gate electrode 110b.

Although the first and second gate electrodes 111 and 110b include the double-layered structure and the single layered structure, respectively, step differences between the gate electrodes 111 and 110b may be reduced and/or prevented because their heights h1 and h2 are the same. Thus, in subsequent processes, such as a planarization, photolithography or etch process performed after forming the gate electrodes 111 and 110b, process margins may be improved.

In some embodiments of the present invention, one of the first and second gate electrodes 111 and 110b corresponds to an NMOS gate electrode and the other is a PMOS gate electrode.

In certain embodiments of the present invention, the first and second gate insulation layers 106a and 106b can be formed of an oxide, an oxynitride or a high dielectric layer having a higher dielectric constant than a silicon oxide. In other embodiments of the present invention, the first and second gate insulation layers 106a and 106b can be formed of different insulation materials. Furthermore, the first and second gate insulation layers 106a and 106b may be the same or different thicknesses.

In some embodiments of the present invention, the upper metallic conductive pattern 110a of the first gate electrode 111 and the second gate electrode 110b are formed of the same material. The lower metallic conductive pattern 107a and the second gate electrode 110b have different work functions from each other. That is, one of the lower metallic conductive pattern 107a and the second gate electrode 110b has a higher work function than the other.

In particular embodiments of the present invention, if the first gate electrode 111 is an NMOS gate electrode and the second gate electrode 110b is a PMOS gate electrode, the second gate electrode 110b may have a higher work function than the lower metallic conductive pattern 107a. In this case, the lower metallic conductive pattern 107a is formed of a metal-containing conductive material of a work function approximately having an energy level of a conduction band of silicon. The second gate electrode 110b can be formed of a metal-containing conductive material of a work function approximately having an energy level of a valence band of silicon. In particular embodiments, the lower metallic conductive pattern 107a is formed of a metal-containing conductive material having a work function ranging from about 4.0 eV to about 4.4 eV. The second gate electrode 110b is formed of a metal-containing conductive material having a work function ranging from about 4.8 eV to about 5.2 eV.

For example, the lower metallic conductive pattern 107a can be formed of one metal layer selected from the group consisting of a hafnium layer, an aluminum layer, a titanium layer, a niobium layer, a tantalum layer and/or a molybdenum layer and/or a conductive metal compound layer such as a first tantalum nitride layer. The second gate electrode 110b can be formed of an iridium layer and/or a platinum layer and/or a conductive metal compound layer selected from the group consisting of a ruthenium dioxide layer, a molybdenum nitride ($Mo_2N$) layer, a tungsten nitride layer and/or a second tantalum nitride layer. The work function of the tantalum nitride layer can be increased as a concentration of nitrogen therein is increased. Accordingly, in some embodiments of the present invention, the first tantalum nitride layer may be a lower concentration of nitrogen than the second tantalum nitride.

However, in other embodiments of the present invention, if the first gate electrode 111 is a PMOS gate electrode and the second gate electrode 110b is an NMOS gate electrode, the lower metallic conductive pattern 107a is formed of a metal-containing conductive material having a higher work function than the second gate electrode 110b. That is, the lower metallic conductive pattern 107a can be formed of a metal-containing conductive material of a work function having approximately an energy level of a valence band of silicon, for example, a work function ranging from about 4.8 eV to about 5.2 eV. The second gate electrode 110b can be formed of a metal-containing conductive material of a work function having approximately an energy level of a conduction band of silicon, for example, a work function ranging from about 4.0 eV to about 4.4 eV.

As described above, because the first and second gate electrodes 111 and 110b have different work functions from each other, the channels under the first gate electrode 111 and the second gate electrode 110b can be formed as surface channels. Thus, the absolute value of threshold voltages of the NMOS and PMOS transistors having the first and second gate electrodes 111 and 110b may be lowered.

In some embodiments of the present invention, the first and second low-resistance conductive patterns 112a and 112b are formed of materials having lower resistance than the first and second gate electrodes 111 and 110b. For example, the first and second low-resistance conductive patterns 112a and 112b can be formed of tungsten and/or aluminum. The overall resistance of the gate patterns 150 and 155 is reduced due to the first and second low-resistance conductive patterns 112a and 112b, which may result in an increased operation speed of the semiconductor device.

The first and second hard mask patterns 114a and 114b can be formed of silicon nitride that is used as a conventional hard mask.

First spacers 118a are disposed on both sidewalls of the first gate electrode pattern 150 and second spacers 118b are disposed on both sidewalls of the second gate pattern 155. The first and second spacers 118a and 118b can be formed of an insulation layer such as a silicon nitride and/or a silicon oxide.

First impurity-doped regions 120a, doped by impurities of a first conductive type, are provided at the first active regions at both sides of the first gate electrode 111. Second impurity-doped regions 120b, doped by impurities of a second conductive type, are provided at the second active regions at both sides of the second gate electrode 110b. The first impurity-doped region 120a can be an LDD structure composed of a first low-concentration diffusion layer 116a and a first high-concentration diffusion layer 119a. The second impurity-doped region 120b can be an LDD structure composed of a second low-concentration diffusion layer 116b and a second high-concentration diffusion layer 119b.

In embodiments of the present invention where the first and second gate electrodes 111 and 110b are an NMOS gate electrode and a PMOS gate electrode, respectively, the first and second impurity-doped regions 120a and 120b can be an N-type impurity-doped region and a P-type impurity-doped region, respectively. In embodiments of the present invention where the first and second gate electrodes 111 and 110b are a PMOS gate electrode and an NMOS gate electrode, respectively, the first and second impurity-doped regions 120a and 120b can be a P-type impurity-doped region and an N-type impurity-doped region, respectively.

In particular embodiments of the present invention, the first and second gate electrodes 111 and 110b are formed of a metal-containing conductive material. This can prevent formation of a depletion layer in the gate electrodes. Because the first and second gate electrodes 111 and 110b are each formed of metal-containing conductive materials of different work functions, the NMOS and PMOS transistors can having surface channels. This and result in thinner effective thicknesses of gate insulation layers of the NMOS and PMOS transistors. Therefore, a CMOS-type semiconductor device may be operated with a high operation speed but a low operation voltage.

Furthermore, because the first and second gate electrodes 111 and 110b have substantially the same heights h1 and h2, there may be no step difference between the gate electrodes 111 and 110b. Thus, it may be possible to improve process margins in subsequent processes performed after forming the gate electrodes 111 and 110b.

FIGS. 2 through 5 are cross-sectional views illustrating methods of forming a semiconductor device having different gate types according to some embodiments of the present invention.

Figure 2:
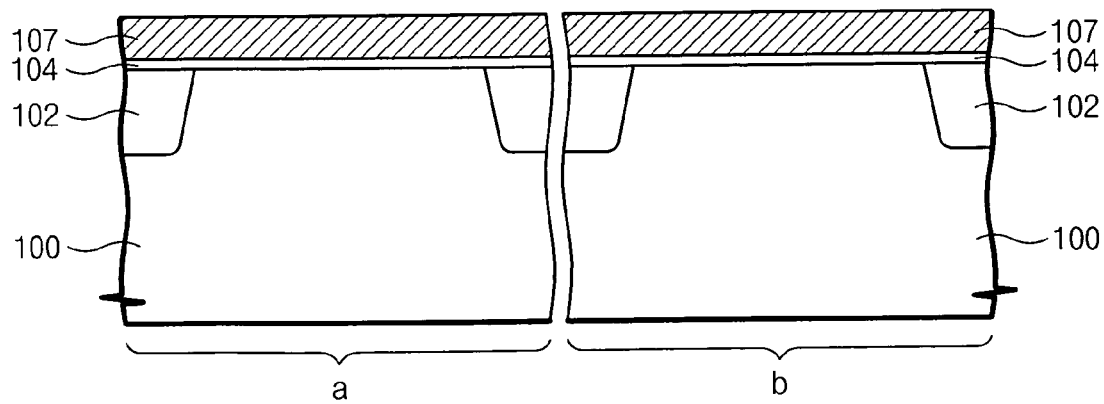
FIGS. 2 through 5 are cross-sectional views illustrating methods of forming a semiconductor device having dual gates according to some embodiments of the present invention.
Figure 3:
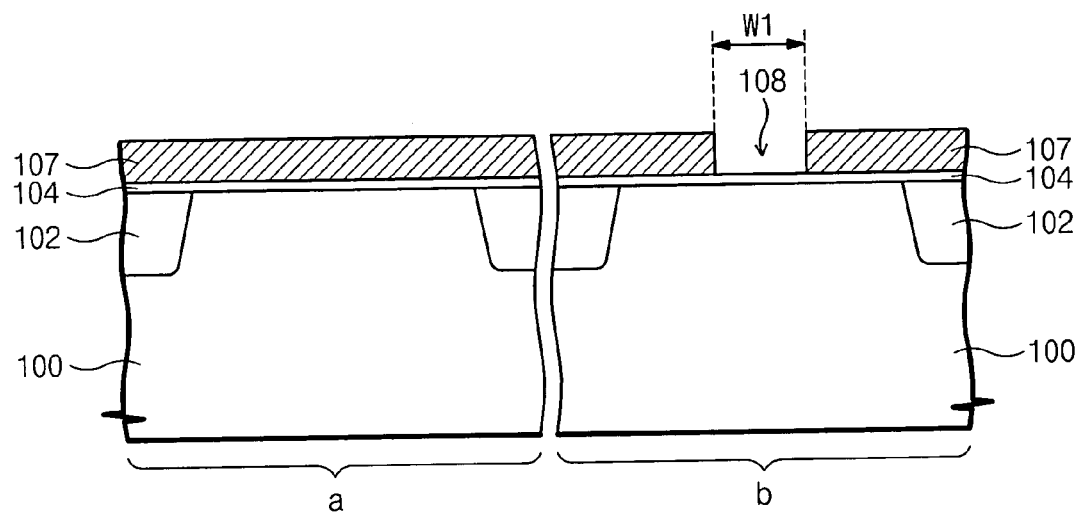

Referring to FIGS. 2 and 3, field oxide layers 102 are formed at a semiconductor substrate 100 having the first region a and the second region b, thereby defining a first active region and a second active region at the first and second regions a and b, respectively. In some embodiments of the present invention, the first and second regions a and b are a NMOS region and a PMOS region or a PMOS region and a NMOS region, respectively.

An insulation layer 104 and a first metallic conductive layer 107 are sequentially blanket formed on the surface of the semiconductor substrate 100 having the field oxide layers 102 therein. The insulation layer 104 may be formed of an oxide, an oxynitride and/or a high dielectric layer having a higher dielectric constant than a silicon oxide. The first metallic conductive layer 107 is formed of a metal-containing conductive layer such as a metal layer or a conductive metal compound.

The first metallic conductive layer 107 is patterned to form an opening 108 exposing a predetermined region of the insulation layer 104 at the second active region. The opening 108 has a first width W1. The opening 108 crosses over the second active region. After forming the opening 108, a curing process can be performed to cure the exposed insulation layer 104. At this time, the temperature of the curing process may be controlled so as to not to form an insulation material at a surface of the first metallic conductive layer 107. The curing process can be performed in an ambient containing inert gas. The insulation layer 104 exposed by the opening 108 can provide the second gate insulation layer 106b of FIG. 1.

Figure 6:
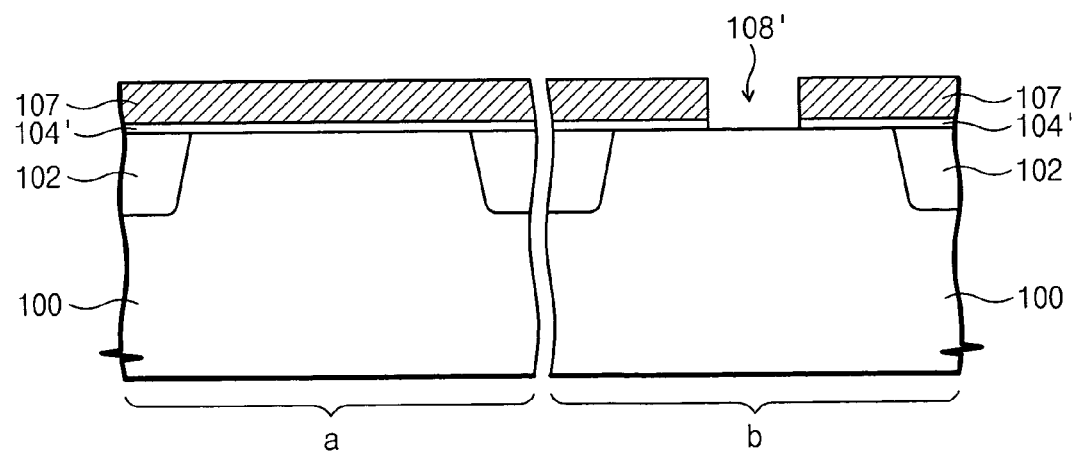
FIGS. 6 and 7 are cross-sectional views illustrating further methods of forming gate insulation layers in a semiconductor device according to some embodiments of the present invention.
Figure 7:
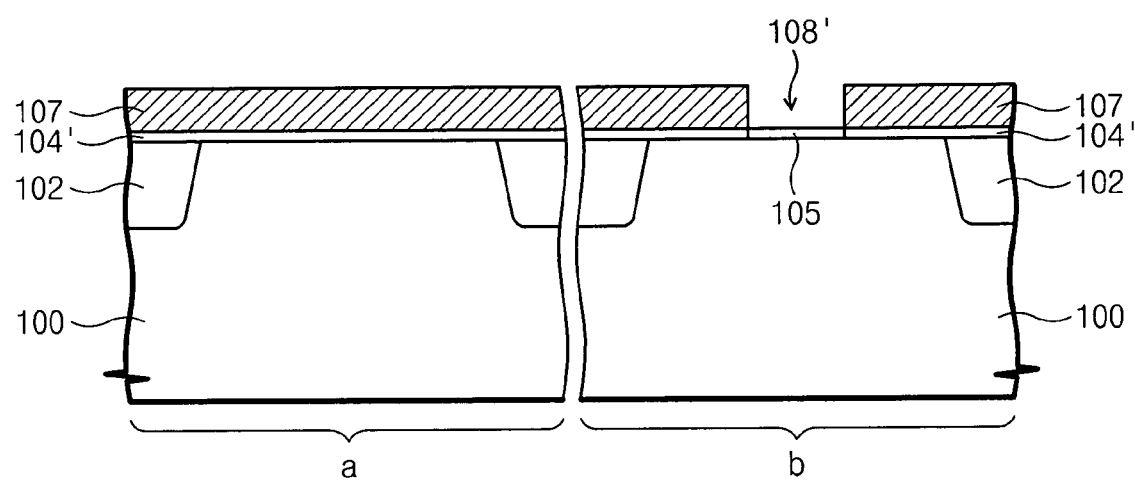

The insulation layer that provides the second gate insulation layer 106b of FIG. 1 can also be formed using other methods, such as those described herein with reference to FIGS. 6 and 7. Referring to FIGS. 6 and 7, a first insulation layer 104' and a first metallic conductive layer 107 are sequentially formed at a semiconductor substrate 100 having first and second active regions defined by field oxide layers 102. The first insulation layer 104' can be formed of the same material as the insulation layer 104 of FIG. 2. The first metallic conductive layer 107 and the first insulation layer 104' are successively patterned to form an opening 108' exposing a predetermined region of the second active region.

A thermal oxidation process or a thermal oxidation nitrification process is performed with respect to the semiconductor substrate 100, thereby forming a second insulation layer 105 on the exposed second active region. The temperature of the thermal process may be controlled to selectively form the second insulation layer 105 only on the exposed semiconductor substrate 100 without forming an insulation material at a surface of the first metallic conductive layer 107. In this case, the first metallic conductive layer 107 can be formed of a metal-containing conductive layer having an anti-oxidizing property or an anti-oxidizing nitrifying property. The second insulation layer 105 can provide the second gate insulation layer 106b of FIG. 1. Accordingly, the first and second gate insulation layers 106a and 106b each can be formed of different insulation materials and/or with different thicknesses.

Figure 4:
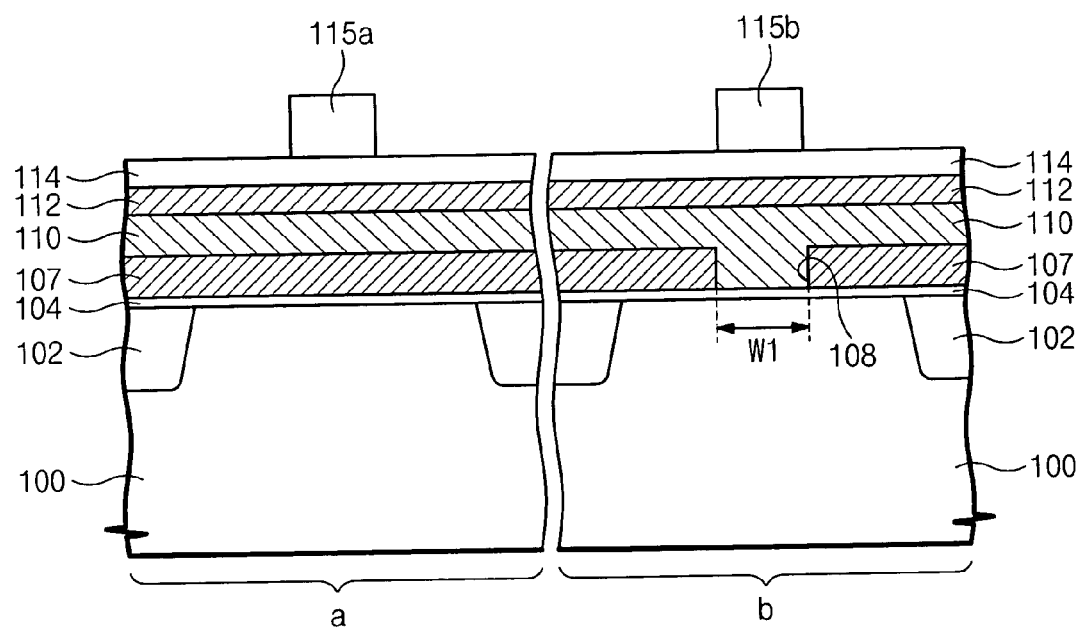
Figure 5:
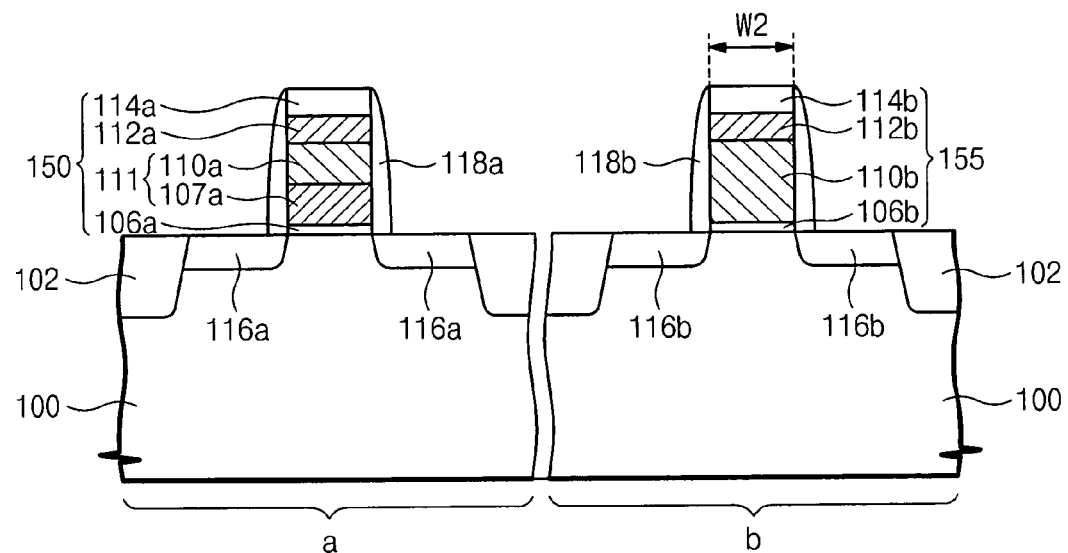

Referring to FIGS. 3 through 5, a second metallic conductive layer 110 is blanket formed on the surface of the semiconductor substrate 100 to fill the opening 108 or 108'. The second metallic conductive layer 110 may be formed to have a planar top surface. Such a planar top surface may be provided by forming the second metallic conductive layer 110 with a thickness of at least about half the first width W1 of the opening 108. Furthermore, a planarization process such as a chemical mechanical polishing (CMP) method can be additionally performed with respect to the top surface of the second metallic conductive layer 110. Thus, a step difference due to the opening 108 may be reduced or eliminated.

The first and second metallic conductive layers 107 and 110 are formed of metal-containing materials having different work functions. That is, one of the first and second metallic conductive layers 107 and 110 has a higher work function than the other. Particularly, one of the first and second metallic conductive layers 107 and 110 can formed of a metal-containing conductive material having a work function of approximately an energy level of a conduction band of silicon. The other of the first and second metallic conductive layers 107 and 110 can be formed of a metal-containing conductive material having a work function of approximately an energy level of a valence band of silicon. In particular, one of the first and second metallic conductive layers 107 and 110 can be formed of a metal-containing conductive material having a work function ranging from about 4.0 eV to about 4.4 eV. The other of the first and second metallic conductive layers 107 and 110 can be formed of a metal-containing conductive material having a work function ranging from about 4.8 eV to about 5.2 eV. For example, the metal-containing conductive material having a relatively low work function can be formed of a hafnium layer, an aluminum layer, a titanium layer, a niobium layer, a tantalum layer and/or a molybdenum layer and/or a conductive metal compound layer such as a first tantalum nitride layer. The metal-containing conductive material having a relatively high work function can be formed of an iridium layer and/or a platinum layer and/or a conductive metal compound layer selected from the group consisting of a ruthenium dioxide layer, a molybdenum nitride ($Mo_2N$) layer, a tungsten nitride layer and/or a second tantalum nitride layer. The work function of the tantalum nitride layer can be increased as a concentration of nitrogen therein is increased. Thus, in some embodiments, the first tantalum nitride layer has a lower concentration of nitrogen than the second tantalum nitride.

A low-resistance conductive layer 112 and a hard mask layer 114 are sequentially formed on the second metallic conductive layer 110. The low-resistance conductive layer 112 is formed of a conductive layer having a lower resistance than the first and second metallic conductive layers 107 and 110, for example tungsten and/or aluminum. The hard mask layer 114 can be formed of silicon nitride.

As illustrated in FIG. 4, a first photoresist pattern 115a is formed on the hard mask layer 114 at the first region a and a second photoresist pattern 115b is formed on the hard mask layer 114 at the second region b. The second photoresist pattern 115b is formed over the insulation layer 104 exposed by the opening 108 or 108'.

As seen in FIG. 5, the hard mask layer 114, the low-resistance conductive layer 112, the second metallic conductive layer 110, the first metallic conductive layer 107 and the insulation layer 104 are successively etched using the first and second photoresist patterns 115a and 115b as masks, thereby forming a first gate pattern 150 crossing over the first active region and a second gate pattern 155 crossing over the second active region. The first gate pattern 150 includes a first gate insulation layer 106a, a first gate electrode 111, a first low-resistance conductive pattern 112a and a first hard mask pattern 114a that are sequentially stacked. The second gate pattern 155 includes a second gate insulation layer 106b, a second gate electrode 110b, a second low-resistance conductive pattern 112b and a second hard mask pattern 114b that are sequentially stacked.

The second gate insulation layer 106b is formed by the insulation layer 104 exposed by the opening 108 or 108'. The second gate pattern 155 is formed to be aligned with the opening 108 or 108'. That is, the first metallic conductive layer 107 in the second region b is removed when the gate patterns 150 and 155 are formed. The second gate pattern 155 has a second width W2.

The second width W2 of the second gate pattern 155 may be narrower than the first width W1 of the opening 108 or 108'. This is for an alignment margin between the second gate electrode 110b and the opening 108 or 108'. That is, the second width W2 may be a value obtained by subtracting the alignment margin between the second gate electrode 110b and the opening 108 or 108' from the first width W1.

The first gate electrode 111 is formed of a double-layered structure including a lower metallic conductive pattern 107a and an upper metallic conductive pattern 110a that are sequentially stacked. The lower metallic conductive pattern 107a is a part of the first metallic conductive layer 107. The upper metallic conductive pattern 110a is a part of the second metallic conductive layer 110. The second gate electrode 110b is formed of a single layered structure. That is, the second gate electrode 110b is formed of a part of the second metallic conductive layer 110 located on the insulation layer 104 or 105 exposed by the opening 108 or 108'. The first and second gate electrodes 111 and 110b may have substantially the same heights due to the planar top surface of the second metallic conductive layer 110.

In the etch process for forming the first and second gate patterns 150 and 155, it is possible to prevent damage of a surface of the second active region at both sides of the second gate pattern 155 due to the identical heights of the first and second gate electrodes 111 and 110b.

If the second metallic conductive layer 110 is formed of a metal-containing conductive material having a higher work function than the first metallic conductive layer 107, the first gate electrode 111 corresponds to an NMOS gate electrode and the second gate electrode 110b corresponds to a PMOS gate electrode. On the other hand, if the first metallic conductive layer 107 is formed of a metal-containing conductive material having a higher work function than the second metallic conductive layer 110, the first gate electrode 111 corresponds to a PMOS gate electrode and the second gate electrode 110b corresponds to an NMOS gate electrode.

Consequently, in the CMOS-type semiconductor device having the first and second gate electrodes 111 and 110b, the NMOS and PMOS transistors can have surface channels. Depletion layers are not formed in the NMOS and PMOS gate electrodes. Thus, it is possible to form a CMOS-type semiconductor device that is operated at a high speed but a low voltage. The first and second gate electrodes 111 and 110b may have substantially the same height. This can prevent damage of active regions that may occur due to a step difference between the first and second gate electrodes 111 and 110b. Additionally, it may be possible to improve a process margin in a subsequent process performed after forming the first and second gate electrodes 111 and 110b. Furthermore, the first and second low-resistance conductive patterns 112a and 112b may each have lower resistances of the first and second gate patterns 150 and 155. Thus, it may be possible to provide a semiconductor device having a faster operation speed.

Returning to FIGS. 4 and 5, the first and second photoresist patterns 115a and 115b may be removed by performing an ashing process. First impurity ions of a low dose are selectively implanted into the first active regions at both sides of the first gate patterns 150 to form first low-concentration impurity-doped regions 116a. Second impurity ions of a low dose are selectively implanted into the second active regions at both sides of the second gate patterns 155 to form second low-concentration impurity-doped regions 116b. If the first gate electrode 111 is an NMOS gate electrode and the second gate electrode 110b is a PMOS gate electrode, the first impurity ions are N-type and the second impurity ions are P-type. On the contrary, if the first gate electrode 111 is a PMOS gate electrode and the second gate electrode 110b is a NMOS gate electrode, the first impurity ions are P-type and the second impurity ions are N-type.

The first and second low-concentration impurity-doped regions 116a and 116b may be sequentially formed. That is, after forming the first low-concentration impurity-doped region 116a, the second low-concentration impurity-doped region 116b can be formed. Alternatively, after forming the second low-concentration impurity-doped region 116b, the first low-concentration impurity-doped region 116a can be formed.

First and second spacers 118a and 118b are formed on sidewalls of the first and second gate electrodes 150 and 155, respectively. The first and second spacers 118a and 118b can be simultaneously or sequentially formed. The first and second spacers 118a and 118b can be formed of an insulation layer such as a silicon oxide and/or silicon nitride. Subsequently, first impurity ions of a high dose are selectively implanted into the first active regions to form a couple of first high-concentration impurity-doped regions 119a of FIG. 1 using the first gate pattern 150 and the first spacer 118a as ion-implantation masks. Second impurity ions of a high dose are selectively implanted into the second active regions to form a couple of second high-concentration impurity-doped regions 119b of FIG. 1 using the second gate pattern 155 and the second spacer 118b as ion-implantation masks. The first and second high-concentration impurity-doped regions 119a and 119b can be formed of impurity ions of the same type as the first and second low-concentration impurity-doped regions 116a and 116b, respectively. The first and second high-concentration impurity-doped regions 119a and 119b can be also sequentially formed.

Accordingly, as described above, in some embodiments of the present invention, the first gate electrode is formed of a double-layered structure including a lower metallic conductive pattern and an upper metallic conductive pattern. The second gate electrode may be formed of a single-layered structure of a metal-containing conductive material. The lower metallic conductive pattern and the second gate electrode may each be formed to have different work functions. Thus, channels under the first and second gate electrodes can be formed as surface channels. Depletion layers are not formed in the NMOS and PMOS gate electrodes. Thus, it may be possible to form a CMOS-type semiconductor device that is operated at a high speed with a low voltage.

Furthermore, the first and second gate electrodes may have substantially the same heights. Thus, there is a reduced or no step difference between the first gate electrode of a double-layered structure and the second gate electrode of a single layered structure. This can prevent damage of a semiconductor substrate that may occur in forming the gate electrodes. Additionally, it may be possible to improve a process margin in a subsequent process performed after forming the gate electrodes.

Embodiments of the present invention have been described with reference to a single layered and a double layered gate electrode structure. However, other numbers of layers could also be provided while still benefiting from the teachings of the present invention. Furthermore, in certain embodiments of the present invention, the gate electrode structures have the same number of layers.

Embodiments of the present invention have been described with reference to formation of the first layer of the multiple layered gate structure prior to formation of the layer of the single layered gate structure. However, such operations may be reversed. For example, the first layer of the multiple layered gate structure may be formed and then patterned to provide the first gate electrode 107a and then the second gate electrode layer 110 formed on the patterned first gate electrode 107a. Accordingly, embodiments of the present invention should not be construed as limited to the particular sequence of operations illustrated.

While the present invention has been particularly shown and described with reference to particular embodiments thereof, it will be understood by those of ordinary skill in the art that various changes in form and details may be made therein without departing from the spirit and scope of the present invention as defined by the following claims.

What is claimed is:

1. A semiconductor device having at least two different gate electrodes, the at least two different gate electrodes, comprising:
   a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
   a second gate electrode on a second gate insulation layer, the second gate electrode comprising a third metal-containing conductive pattern on the second gate insulation layer, wherein the third metal-containing conductive pattern has a surface opposite the second gate insulation layer that is substantially planar with the surface of the second metal-containing conductive pattern; and
   wherein the first metal-containing conductive pattern and the third metal-containing conductive pattern have different work functions from each other and wherein the second metal-containing conductive pattern and the third metal-containing conductive pattern comprise a same metal-containing conductive material.

2. The semiconductor device of claim 1, wherein the first gate insulation layer and the second gate insulation layer comprise a same insulation material.

3. A semiconductor device having at least two different gate electrodes, the at least two different gate electrodes, comprising:
   a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
   a second gate electrode on a second gate insulation layer, the second gate electrode comprising a third metal-containing conductive pattern on the second gate insulation layer, wherein the third metal-containing conductive pattern has a surface opposite the second gate insulation layer that is substantially planar with the surface of the second metal-containing conductive pattern; and
   wherein the first metal-containing conductive pattern and the third metal-containing conductive pattern have different work functions from each other and wherein the first gate insulation layer and the second gate insulation layer comprise different insulation materials.

4. The semiconductor device of claim 1, wherein the first gate insulation layer and the second gate insulation layer have a same thickness.

5. A semiconductor device having at least two different gate electrodes, the at least two different gate electrodes, comprising:
   a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
   a second gate electrode on a second gate insulation layer, the second gate electrode comprising a third metal-containing conductive pattern on the second gate insulation layer, wherein the third metal-containing conductive pattern has a surface opposite the second gate insulation layer that is substantially planar with the surface of the second metal-containing conductive pattern; and wherein the first metal-containing conductive pattern and the third metal-containing conductive pattern have different work functions from each other and wherein the first gate insulation layer and the second gate insulation layer have different thicknesses.

6. The semiconductor device of claim 1, wherein one of the first metal-containing conductive pattern and the third metal-containing conductive pattern comprises a material having a work function ranging from about 4.0 eV to about 4.4 eV and the other of the first metal-containing conductive pattern and the third metal-containing conductive pattern comprises a material having a work function ranging from about 4.8 eV to about 5.2 eV.

7. The semiconductor device of claim 1, wherein one of the first metal-containing conductive pattern and the third metal-containing conductive pattern comprises a hafnium layer, an aluminum layer, a titanium layer, a niobium layer, a tantalum layer, a molybdenum layer and/or a tantalum nitride layer, and the other of the first metal-containing conductive pattern and the third metal-containing conductive pattern comprises an iridium layer, a platinum layer, a ruthenium dioxide layer, a molybdenum nitride ($Mo_2N$) layer, a tungsten nitride layer and/or a tantalum nitride layer.

8. A semiconductor device having at least two different gate electrodes, the at least two different gate electrodes, comprising:
a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
a second gate electrode on a second gate insulation layer, the second gate electrode comprising a third metal-containing conductive pattern on the second gate insulation layer, wherein the third metal-containing conductive pattern has a surface opposite the second gate insulation layer that is substantially planar with the surface of the second metal-containing conductive pattern; and
wherein the first metal-containing conductive pattern and the third metal-containing conductive pattern have different work functions from each other and wherein one of the first metal-containing conductive pattern and the third metal-containing conductive pattern comprises a first tantalum nitride layer and the other of the first metal-containing conductive pattern and the third metal-containing conductive pattern comprises a second tantalum nitride layer having a different nitrogen concentration from the first tantalum nitride.

9. A semiconductor device having at least two different gates, comprising:
a first gate insulation layer on a first active region of a semiconductor substrate;
a second gate insulation layer on a second active region of the semiconductor substrate;
a first gate electrode comprising a double-layered structure on the first gate insulation layer, the double layered structure comprising a first metallic conductive pattern and a second metallic conductive pattern and having a first surface adjacent the first gate insulation layer and a second surface opposite the first surface;
a second gate electrode of a single-layered structure on the second gate insulation layer, the single layered structure comprising a metal-containing conductive material and having a first surface adjacent the second gate insulation layer and a second surface opposite the first surface; and
wherein the first metallic conductive pattern and the metal-containing conductive material have different work functions from each other, the second metallic conductive pattern and the metal-containing conductive material are formed of the same material, the second surface of the double-layered structure is a top surface of the second metallic conductive pattern, and the second surface of the double-layered structure and the second surface of the single layered structure are disposed at substantially a same distance from the semiconductor substrate.

10. The semiconductor device of claim 9, further comprising field oxide layers provided at the semiconductor substrate to define the first active region and the second active region.

11. The semiconductor device of claim 10, wherein the second metallic conductive pattern comprises the metal-containing conductive material.

12. The semiconductor device of claim 10, wherein one of the first metallic conductive pattern and the metal-containing conductive material has a work function ranging from about 4.0 eV to about 4.4 eV and the other of the first metallic conductive pattern and the metal-containing conductive material has a work function ranging from about 4.8 eV to about 5.2 eV.

13. The semiconductor device of claim 10, wherein one of the first metallic conductive pattern and the metal-containing conductive material comprises a hafnium layer, an aluminum layer, a titanium layer, a niobium layer, a tantalum layer, a molybdenum layer and/or a tantalum nitride layer, and the other of the first metallic conductive pattern and the metal-containing conductive material comprises an iridium layer, a platinum layer, a ruthenium dioxide layer, a molybdenum nitride ($Mo_2N$) layer, a tungsten nitride layer and/or a tantalum nitride layer.

14. A semiconductor device having at least two different gates, comprising:
a first gate insulation layer on a first active region of a semiconductor substrate;
a second gate insulation layer on a second active region of the semiconductor substrate;
a first gate electrode comprising a double-layered structure on the first gate insulation layer, the double layered structure comprising a first metallic conductive pattern and a second metallic conductive pattern and having a first surface adjacent the first gate insulation layer and a second surface opposite the first surface;
a second gate electrode of a single-layered structure on the second gate insulation layer, the single layered structure comprising a metal-containing conductive material and having a first surface adjacent the second gate insulation layer and a second surface opposite the first surface;
wherein the first metallic conductive pattern and the metal-containing conductive material have different work functions from each other, and the second surface of the double-layered structure and the second surface of the single layered structure are disposed at substantially same distance from the semiconductor substrate; and
field oxide layers provided at the semiconductor substrate to define the first active region and the second active region;

wherein one of the first metallic conductive pattern and the metal-containing conductive material comprises a first tantalum nitride layer and the other of the first metallic conductive pattern and the metal-containing conductive material comprises a second tantalum nitride layer and wherein the first tantalum nitride layer has a different nitrogen concentration from the second tantalum nitride.

15. The semiconductor device of claim 10, wherein the first and second gate insulation layers comprise a same insulation material.

16. A semiconductor device having at least two different gates, comprising:
 a first gate insulation layer on a first active region of a semiconductor substrate;
 a second gate insulation layer on a second active region of the semiconductor substrate;
 a first gate electrode comprising a double-layered structure on the first gate insulation layer, the double layered structure comprising a first metallic conductive pattern and a second metallic conductive pattern and having a first surface adjacent the first gate insulation layer and a second surface opposite the first surface;
 a second gate electrode of a single-layered structure on the second gate insulation layer, the single layered structure comprising a metal-containing conductive material and having a first surface adjacent the second gate insulation layer and a second surface opposite the first surface; and
 field oxide layers provided at the semiconductor substrate to define the first active region and the second active region;
 wherein the first metallic conductive pattern and the metal-containing conductive material have different work functions from each other, and the second surface of the double-layered structure and the second surface of the single layered structure are disposed at substantially a same distance from the semiconductor substrate and wherein the first and second gate insulation layers comprise different insulation materials from each other.

17. The semiconductor device of claim 10, further comprising:
 a first low-resistance conductive pattern stacked on the first gate electrode; and
 a second low-resistance conductive pattern stacked on the second gate electrode,
 wherein the first low-resistance conductive pattern and the second low-resistance conductive pattern are of conductive materials having lower resistances than the first gate electrode and the second gate electrode.

18. The semiconductor device of claim 10, further comprising:
 first impurity-doped regions doped by impurities of a first conductive type in the first active region at both sides of the first gate electrode; and
 second impurity-doped regions doped by impurities of a second conductive type in the second active region at both sides of the second gate electrode.

19. A method of fabricating a semiconductor device having at least two different gate electrodes, the at least two different gaze electrodes, comprising:
 forming a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
 forming a second gate electrode on a second gate insulation layer, the second gate electrode comprising a third metal-containing conductive pattern on the second gate insulation layer, wherein the third metal-containing conductive pattern has a surface opposite the second gate insulation layer that is substantially planar with the surface of the second metal-containing conductive pattern; and
 wherein the first metal-containing conductive pattern and the third metal-containing conductive pattern have different work functions from each other and wherein the second metal-containing conductive pattern and the third metal-containing conductive pattern are a same metal-containing conductive material.

20. The method of claim 19, wherein the first gate insulation layer and the second gate insulation layer comprise a same insulation material.

21. A method of fabricating a semiconductor device having at least two different gate electrodes, the at least two different gate electrodes, comprising:
 forming a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
 forming a second gate electrode on a second gate insulation layer the second gate electrode comprising a third metal-containing conductive material on the second gate insulation layer, wherein the third metal-containing conductive pattern has a surface opposite the second gate insulation layer that is substantially planar with the surface of the second metal-containing conductive pattern; and
 wherein the first metal-containing conductive pattern and the third metal-containing conductive pattern have different work functions from each other and wherein the first gate insulation layer and the second gate insulation layer comprise different insulation materials.

22. The method of claim 19, wherein the first gate insulation layer and the second gaze insulation layer have a same thickness.

23. A method of fabricating a semiconductor device having at least two different gate electrodes, the at least two different gate electrodes, comprising:
 forming a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
 forming a second gate electrode on a second gate insulation layer the second gate electrode comprising a third metal-containing conductive material on the second gate insulation layer, wherein the third metal-containing conductive pattern has a surface opposite the second gate insulation layer that is substantially planar with the surface of the second metal-containing conductive pattern; and
 wherein the first metal-containing conductive pattern and the third metal-containing conductive pattern have different work functions from each other and wherein the first gate insulation layer and the second gate insulation layer have different thicknesses.

24. The method of claim 19, wherein one of the first metal-containing conductive pattern and the third metal-containing conductive pattern comprises a material having a work function ranging from about 4.0 eV to about 4.4 eV and the other of the first metal-containing conductive pattern and the third metal-containing conductive pattern comprises a material having a work function ranging from about 4.8 eV to about 5.2 eV.

25. The method of claim 19, wherein one of the first metal-containing conductive pattern and the third metal-containing conductive pattern comprises a hafnium layer, an aluminum layer, a titanium layer, a niobium layer, a tantalum layer, a molybdenum layer and/or a tantalum nitride layer, and the other of the first metal-containing conductive pattern and the third metal-containing conductive pattern comprises an iridium layer, a platinum layer, a ruthenium dioxide layer, a molybdenum nitride ($Mo_2N$) layer, a tungsten nitride layer and/or a tantalum nitride layer.

26. A method of fabricating a semiconductor device having at least two different gate electrodes, the at least two different gate electrodes, comprising:
  forming a first gate electrode on a first gate insulation layer, the first gate electrode comprising a first metal-containing conductive pattern on the first gate insulation layer and a second metal-containing conductive pattern on the first metal-containing conductive pattern opposite the first gate insulation layer, the second metal-containing conductive pattern having a surface opposite the first gate insulation layer;
  forming a second gate electrode on a second gate insulation layer the second gate electrode comprising a third metal-containing conductive material on the second gate insulation layer, wherein the third metal-containing conductive pattern has a surface opposite the second gate insulation layer that is substantially planar with the surface of the second metal-containing conductive pattern; and
  wherein the first metal-containing conductive pattern and the third metal-containing conductive pattern have different work functions from each other and wherein one of the first metal-containing conductive pattern and the third metal-containing conductive pattern comprises a first tantalum nitride layer and the other of the first metal-containing conductive pattern and the third metal-containing conductive pattern comprises a second tantalum nitride layer having a different nitrogen concentration from the first tantalum nitride.

27. A method of forming a semiconductor device having two different gates, comprising:
  sequentially forming a first insulation layer and a first metallic conductive layer on a surface of the semiconductor substrate having a first active region and a second active region;
  patterning the first metallic conductive layer to form an opening exposing a first insulation layer on a predetermined region of the second active region;
  forming a second metallic conductive layer on a surface of the semiconductor substrate to fill the opening;
  successively patterning the second metallic conductive layer, the first metallic conductive layer and the first insulation layer to form a first gate insulation layer and a first gate electrode of a double-layered structure at the first active region and to form a second gate insulation layer and a second gate electrode of a single-layered structure at the second active region,
  wherein the first metallic conductive layer and the second metallic conductive layer have a different work function from each other, and the first gate electrode includes a first metallic conductive pattern and a second metallic conductive pattern that are sequentially stacked.

28. The method of claim 27, further comprising:
  forming field oxide layers at a semiconductor substrate having a first region and a second region to define the first active region and the second active region at the first region and the second region, respectively.

29. The method of claim 27, wherein one of the first metallic conductive layer and the second metallic conductive layer comprises a metal-containing conductive material having a work function ranging from about 4.0 eV to about 4.4 eV and the other of the first metallic conductive layer and the second metallic conductive layer comprises a metal-containing conductive material having a work function ranging from about 4.8 eV to about 5.2 eV.

30. The method of claim 27, wherein one of the first metallic conductive layer and the second metallic conductive layer comprises a hafnium layer, an aluminum layer, a titanium layer, a niobium layer, a tantalum layer, a molybdenum layer and/or a tantalum nitride layer, and the other of the first metallic conductive layer and the second metallic conductive layer comprises an iridium layer, a platinum layer, a ruthenium dioxide layer, a molybdenum nitride ($Mo_2N$) layer, a tungsten nitride layer and/or a tantalum nitride layer.

31. The method of claim 27, wherein one of the first metallic conductive layer and the second metallic conductive layer comprises a first tantalum nitride layer and the other of the first metallic conductive layer and the second metallic conductive layer comprises a second tantalum nitride layer, wherein the first tantalum nitride layer has a different nitrogen concentration from the second tantalum nitride.

32. The method of claim 27, further comprising selectively curing the exposed first insulation layer before forming the second metallic conductive layer.

33. The method of claim 27, wherein forming the second metallic conductive layer is preceded by:
  removing the first insulation layer exposed by the opening to expose a predetermined region of the second active region; and
  selectively forming a second insulation layer at a surface of the exposed second active region,
  wherein the second metallic conductive layer is formed on the first metallic conductive layer and the second insulation layer.

34. The method of claim 27, wherein the second metallic conductive layer is formed to have a planar top surface.

35. The method of claim 34, wherein the second metallic conductive layer is formed with a thickness of at least half width of the opening.

36. The method of claim 34, further comprising planarizing a top surface of the second metallic conductive layer alter forming the second metallic conductive layer.

37. The method of claim 27, wherein forming the second metallic conductive layer is followed by forming a low-resistance conductive layer having a lower resistance than the first metallic conductive layer and the second metallic conductive layer on the second metallic conductive layer,
  wherein forming the gate electrodes comprises successively patterning the low-resistance conductive layer, the second metallic conductive layer, the first metallic conductive layer and the first insulation layer to form the first gate insulation layer, the first gate electrode and a first low resistance conductive pattern sequentially stacked on the first active region and to form the second gate insulation layer, the second gate electrode and a second low resistance conductive pattern sequentially stacked on the second active region.

38. The method of claim 27, wherein the second gate electrode is formed of a part of the second metallic conductive layer.

39. The method of claim 27, wherein the second gate electrode has a narrower width than the width of the opening.

40. The method of claim 27, further comprising:
forming first impurity-doped regions doped by impurities of a first conductive type at the first active region at both sides of the first gate electrode; and
forming second impurity-doped regions doped by impurities of a second conductive type at the second active region at both sides of the second gate electrode.

* * * * *

UNITED STATES PATENT AND TRADEMARK OFFICE
CERTIFICATE OF CORRECTION

PATENT NO. : 7,056,776 B2
APPLICATION NO. : 10/940159
DATED : June 6, 2006
INVENTOR(S) : Park et al.

It is certified that error appears in the above-identified patent and that said Letters Patent is hereby corrected as shown below:

Column 16,
Line 63 should read -- tially a same distance form the semiconductor substrate; --

Column 18,
Line 45 should read -- insulation layer and the second gate insulation layer have a --

Column 20,
Line 56 should read -- conductive layer is formed with a thickness of at least half a --

Line 60 should read -- after forming the second metallic conductive layer. --

Signed and Sealed this

Fourteenth Day of November, 2006

JON W. DUDAS
*Director of the United States Patent and Trademark Office*